US006917686B2

(12) United States Patent
Jot et al.

(10) Patent No.: US 6,917,686 B2
(45) Date of Patent: Jul. 12, 2005

(54) ENVIRONMENTAL REVERBERATION PROCESSOR

(75) Inventors: Jean-Marc M Jot, Aptos, CA (US); Sam Dicker, Santa Cruz, CA (US); Luke S. Dahl, Santa Cruz, CA (US)

(73) Assignee: Creative Technology, Ltd., Singapore (SG)

( * ) Notice: Subject to any disclaimer, the term of this patent is extended or adjusted under 35 U.S.C. 154(b) by 478 days.

(21) Appl. No.: 09/782,908

(22) Filed: Feb. 12, 2001

(65) Prior Publication Data

US 2001/0024504 A1 Sep. 27, 2001

Related U.S. Application Data

(63) Continuation-in-part of application No. 09/441,141, filed on Nov. 12, 1999, now Pat. No. 6,188,769.

(60) Provisional application No. 60/108,244, filed on Nov. 13, 1998.

(51) Int. Cl.[7] .................................................. H03G 3/00

(52) U.S. Cl. ............................................ 381/63; 381/61

(58) Field of Search .............................. 381/61, 62, 63, 381/66

(56) References Cited

U.S. PATENT DOCUMENTS

| | | |
|---|---|---|
| 4,731,848 A | 3/1988 | Kendall et al. |
| 4,817,149 A | 3/1989 | Myers |
| 5,436,975 A | 7/1995 | Lowe et al. |
| 5,555,306 A | 9/1996 | Gerzon |
| 5,666,136 A * | 9/1997 | Fujishita et al. ............ 345/823 |
| 5,812,674 A | 9/1998 | Jot et al. |

OTHER PUBLICATIONS

"Analysis and Synthesis of Room Reverberation Based on a Statistical Time–Frequency Model," Jot et al., *103rd Convention of Audio Engineering Society*, Sep. 26–29, 1997, New York, N.Y.

* cited by examiner

*Primary Examiner*—Minsun Oh Harvey
(74) *Attorney, Agent, or Firm*—Schwegman, Lundberg, Woessner & Kluth, P.A.

(57) ABSTRACT

A method and apparatus for processing sound sources to simulate environmental effects includes source channel blocks for each source and single reverberation block. The source channel blocks include direct, early reflection, and late reverberation blocks for conditioning the source feeds to include delays, spectral changes, and attenuations depending on the position, orientation and directivity of the sound sources, the position and orientation of the listener, and the position and sound transmision and reflection properties of obstacles and walls in a modeled environment. The outputs of the source channel blocks are combined and provided to single reverberation block generating both the early reflections and the late reverberation for all sound sources.

18 Claims, 5 Drawing Sheets

ENVIRONMENTAL REVERBERATION PROCESSOR

CROSS-REFERENCES TO RELATED APPLICATIONS

This application is a continuation of and claims priority from application Ser. No. 09/441,141, filed Nov. 12, 1999 now U.S. Pat. No. 6,188,769, which is a continuation of and claims priority from provisional application No. 60/108,244 filed Nov. 13, 1998, the disclosures of which are both incorporated herein by reference.

BACKGROUND OF THE INVENTION

Virtual auditory displays (including computer games, virtual reality systems or computer music workstations) create virtual worlds in which a virtual listener can hear sounds generated from sound sources within these worlds. In addition to reproducing sound as generated by the source, the computer also processes the source signal to simulate the effects of the virtual environment on the sound emitted by the source. In a computer game, the player hears the sound that he/she would hear if he/she were located in the position of the virtual listener in the virtual world.

One important environmental factor is reverberation, which refers to the reflections of the generated sound which bounce off objects in the environment. Reverberation can be characterized by measurable criteria, such as the reverberation time, which is a measure of the time it takes for the reflections to become imperceptible. Computer generated sounds without reverberation sound dead or dry.

Reverberation processing is well-known in the art and is described in an article by Jot et al. entitled "*Analysis and Synthesis of Room Reverberation Based on a Statistical Time-Frequency Model*", presented at the 103rd Convention of the Audio Engineering Society, 60 East 42nd St. N.Y., N.Y., 10165-2520.

As depicted in FIG. 1, a model of reverberation presented in Jot et al. breaks the reverberation effects into discrete time segments. The first signal that reaches the listener is the direct signal which undergoes no reflections. Subsequently, a series of discrete "early" reflections are received during an initial period of the reverberation response. Finally, after a critical time, the "late" reverberation is modeled statistically because of the combination and overlapping of the various reflections. The magnitudes of Reflections_delay and Reverb_delay are typically dependent on the size of the room and on the position of the source and the listener in the room.

FIG. 14 of Jot et al. depicts a reverberation model (Room) that breaks the reverberation process into "early", "cluster", and "reverb" phases. In this model, a single feed from the sound source is provided to the Room module. The early module is a delay unit producing several delayed copies of the mono input signal which are used to render the early reflections and feed subsequent stages of the reverberator. A Pan module can be used for directional distribution of the direct sound and the early reflections and for diffuse rendering of the late reverberation decay.

In the system of FIG. 14 of Jot et al. the source signal is fed to early block $R_1$ and a reverb block $R_3$ for reverberation processing and then fed to a pan block to add directionality. Thus, processing multiple source feeds requires implementing blocks $R_1$ and $R_3$ for each source. The implementation of these blocks is computationally costly and thus the total cost can become prohibitive on available processors for more than a few sound sources.

Other systems utilize angular panning of the direct sound and a fraction of the reverberation or sophisticated reverberation algorithms providing individual control of each early reflection in time, intensity, and direction, according to the geometry and physical characteristics of the room boundaries, the position and directivity patterns of the source, and the listening setup.

Research continues in methods to create realistic sounds in virtual reality and gaming environments.

SUMMARY OF THE INVENTION

According to one aspect of the invention, a method and system processes individual sounds to realistically render, over headphones or 2 or more loudspeakers, a sound scene representing multiple sound sources at different positions relative to a listener located in a room. Each sound source is processed by an associated source channel block to generate processed signals which are combined and processed by a single reverberation block to reduce computational complexity.

According to another aspect, each sound source provides several feeds which are sent separately to an early reflection block and a late reverberation block.

According to another aspect of the invention, the early reflection feed is encoded in multi-channel format to allow a different distribution of reflections for each individual source channel characterized by a different intensity and spectrum, different time delay and different direction of arrival relative to the listener.

According to another aspect of the invention, the late reverberation block provides a different reverberation intensity and spectrum for each source.

According to another aspect of the invention, the intensity and direction of the reflections and late reverberation are automatically adjusted according to the position and directivity of the sound sources, relative the position and orientation of the listener.

According to another aspect of the invention, the intensity and direction of the reflections and late reverberation are automatically adjusted to simulate muffling effects due to occlusion by walls located between the source and listener and obstruction due to diffraction around obstacles located between the source and the listener.

Additional features and advantages of the invention will be apparent in view of the following detailed description and appended drawings.

DESCRIPTION OF THE SPECIFIC EMBODIMENTS

Figure 2:
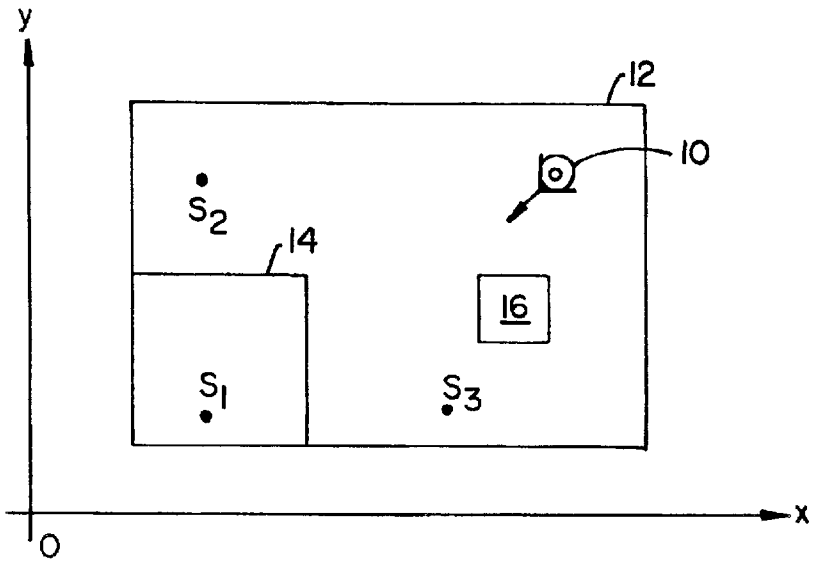
FIG. 2 is a diagram representing a typical sound scene.

The present invention is a system for processing sounds from multiple sources to render a sound scene representing the multiple sounds at different positions in a room. FIG. 2 depicts a sound scene that can be rendered by embodiments of the present invention.

In FIG. 2 a listener 10 is located in a room 12. The room 12 includes a smaller room 14 and an obstacle in the form of a rectangular cabinet 16. A first sound source S1 is located in the small room 14 and second and third sound sources S2 and S3 are located in the large room 12. The location of the listener, sound sources, walls and obstacles are defined relative to a coordinate system (shown in FIG. 2 as an x, y grid). In the real world the sound sources can have a directivity, the sounds would reflect off the walls to create reverberation, the sound waves would undergo diffraction around obstacles, and be attenuated when passing through walls.

Figure 3:
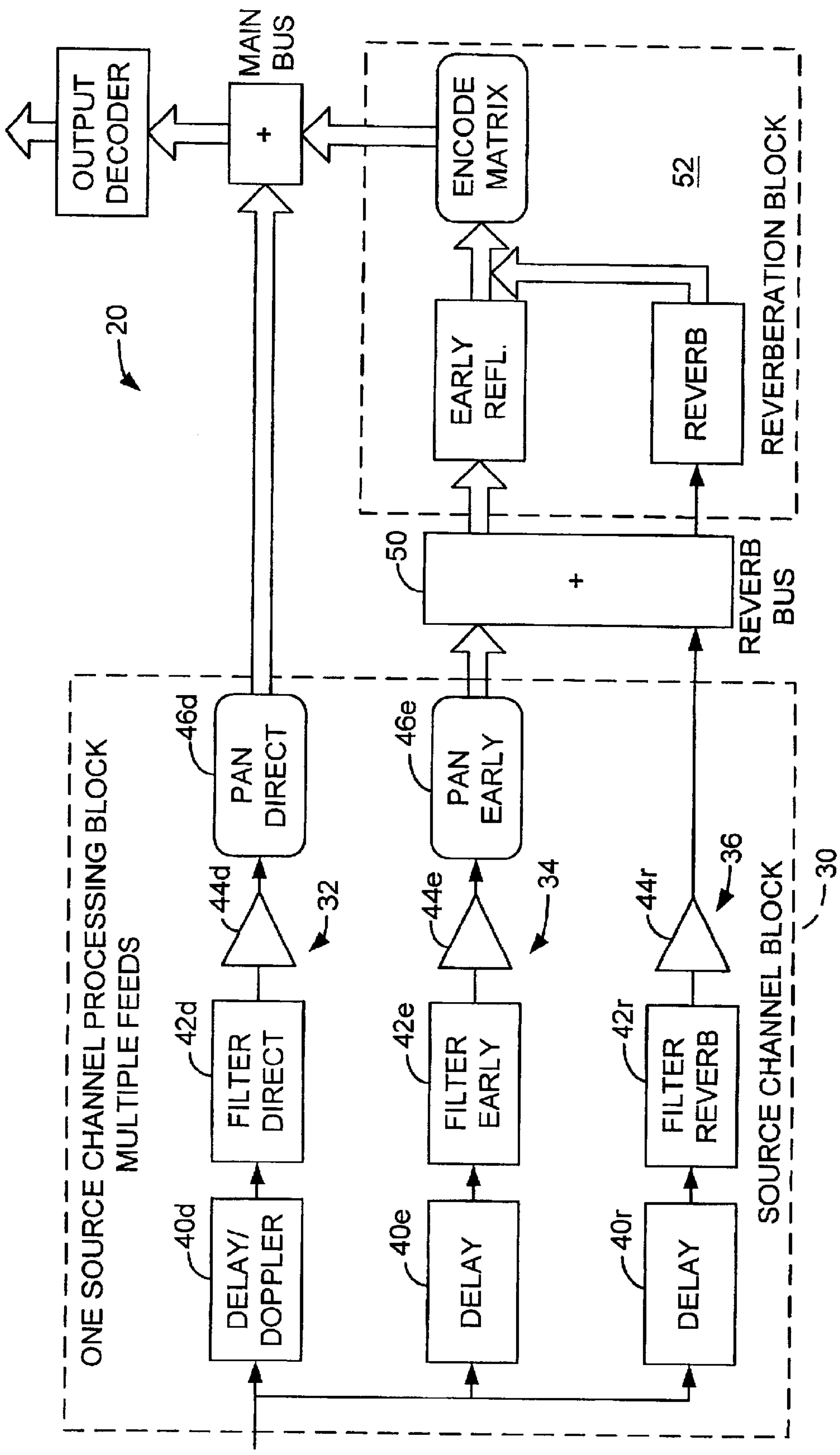
FIG. 3 is a high-level diagram of a preferred embodiment of the invention.

FIG. 3 depicts an embodiment of the general reverberation processing model 20 of the present invention for rendering a sound scene. In FIG. 3 the processing for only one source channel block 30 is depicted. The incoming source channel block is broken into separate feeds for the direct, early reflection, and late reverberation paths 32, 34, and 36. Each path includes a variable delay, low-pass filter, and attenuation element 40, 42, and 44. The direct and early filter paths include pan units 46 to add directionality to the signals. If additional sources are to be processed then additional source channel blocks are added (not shown), one for each source. However, the signals from each source channel block are combined on a reverb bus 50 and routed to the single reverberation block 52 which implements early reflections and late reverberation.

Figure 4:
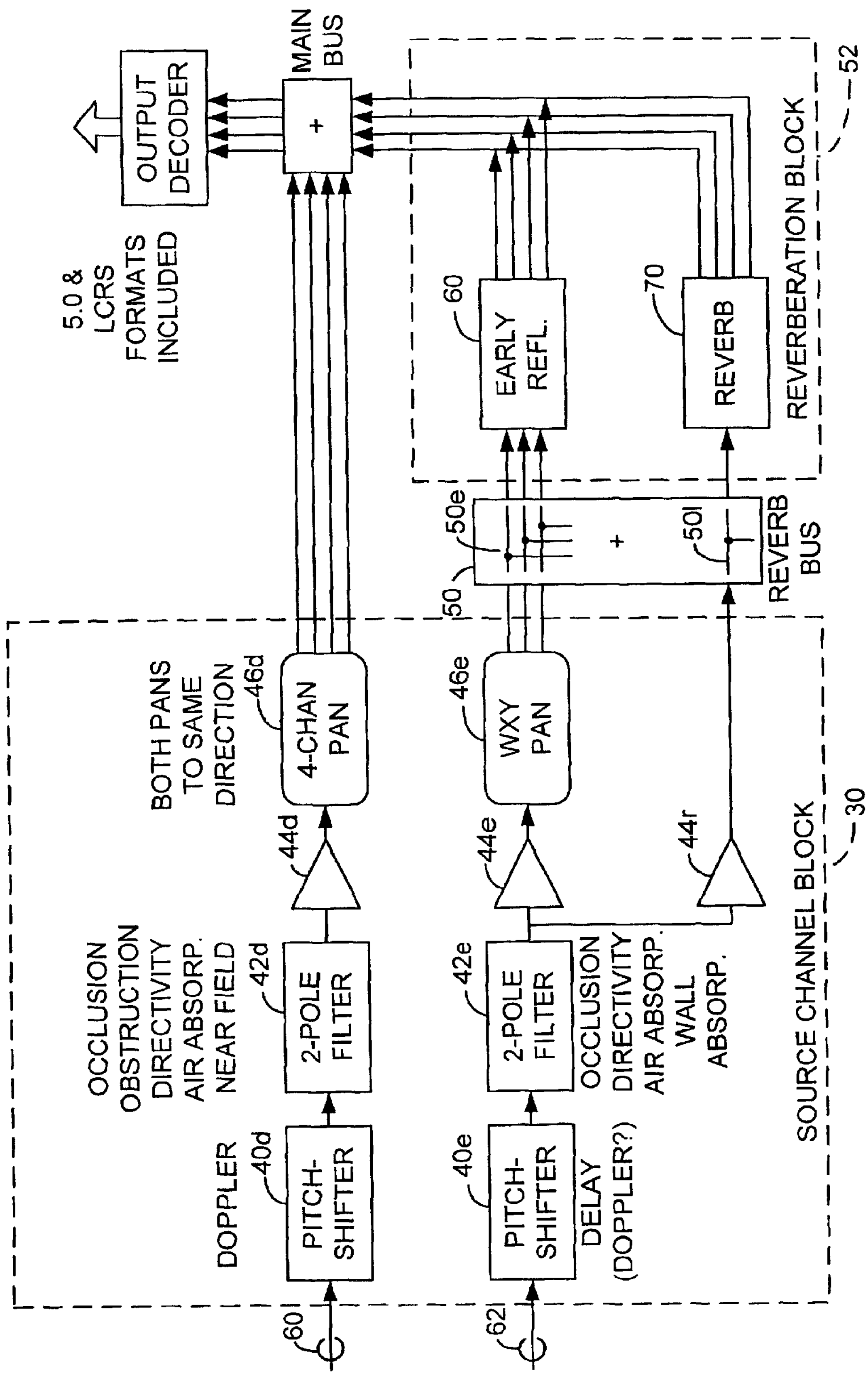
FIG. 4 is an implementation of the system of FIG. 3.

FIG. 4 depicts a particular implementation of the model depicted in FIG. 3. In FIGS. 3 and 4, the early reflection path 34 uses a 3-channel directional encoding scheme (W, L, R) and the dry signal (direct path) uses a 4-channel discrete panning technique. The same source signal feeds the two source channel block inputs 60 and 62 on the left of FIG. 4. Doppler effect or pitch shifting may be implemented in the delay blocks 40. Reproducing the Doppler effect is useful to simulate the motion of a sound source towards or away from the listener. The reverb bus 50 includes a early sub-bus 50*e* for combining multi-channel outputs from early paths 34 in multiple source channel blocks and also includes a late reverberation line 501 for combining the single channel outputs of late reverberation paths 34 of multiple source channel blocks. The reverberation block 52 includes an early reflection block 60 coupled to the early sub-bus 50*e* to receive the combined outputs of the early path of each source channel block. The reverberation block 52 also includes a late reverberation block coupled to the late reverberation line 501 to receive the combined outputs to the late reverberation path of each source channel block.

The control parameters for controlling the magnitudes of the delay, the transfer function of the low-pass filter, and the level of attenuation are indicated in FIG. 4. These control parameters are passed from an application to the reverberation processing model 20.

Figure 1:
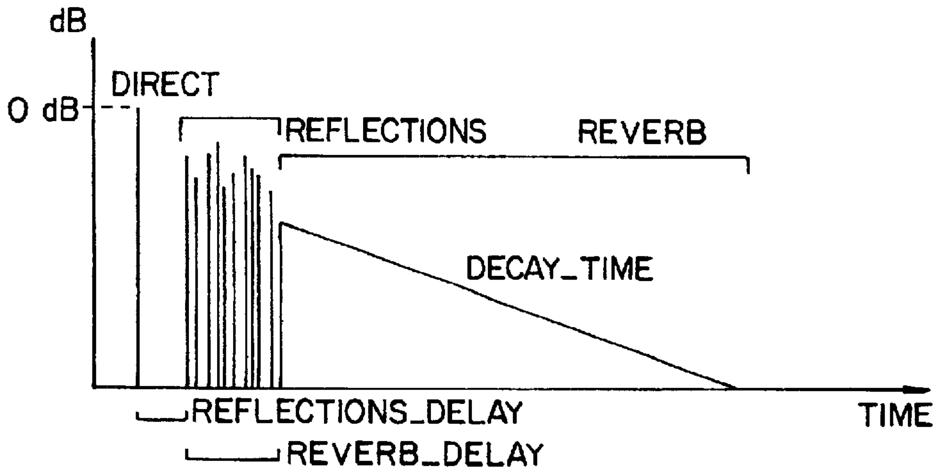
FIG. 1 is a graph depicting the time and intensities of the direct sound, early reflections, and late reverberation components.

The delay elements 40 implement the temporal division between the reverberation sections labeled Direct (Direct path 32), Reflections (early reflection path 34), and Reverb (late reverberation path 36) depicted in FIG. 1.

The processing model for each sound source comprises an attenuation 44 and a low-pass filter 42 that are applied independently to the direct path 32 and the reflected sound 34 as depicted in FIGS. 3 and 4. All the sound-source properties have the effect of adjusting these attenuation and filter parameters.

In one embodiment of the invention, all spectral effects are controlled by specifying an attenuation at a reference high frequency of 5 kHz. All low-pass effects are specified as high-frequency attenuations in dB relative to low frequencies. This manner of controlling low-pass effects is similar to a using a graphic equalizer (controlling levels in fixed frequency bands). It allows the sound designer to predict the overall effect of combined (cascaded) low-pass filtering effects by adding together the resulting attenuations at 5 kHz. This method of specifying low-pass filters is also used in the definition of the Occlusion and Obstruction properties and in the source directivity model as described below.

The "Direct filter" 42*d* is a low-pass filter that affects the Direct component by reducing its energy at high frequencies. The "Room filter" 42*e* in FIG. 4 is a low-pass filter that affects the Reverberation component by reducing its energy at high frequencies.

As is well known in the art, multi-channel signals are fed to loudspeaker arrays to simulate 3-dimensional audio effects. These 3-dimensional effects can also be encoded into stereo signals for headphones. In FIG. 3, the early reflection path feed is encoded in a multi-channel format to allow rendering a different distribution of early reflections for each source channel which is characterized by a different direction of arrival with respect to the listener.

Figure 5:
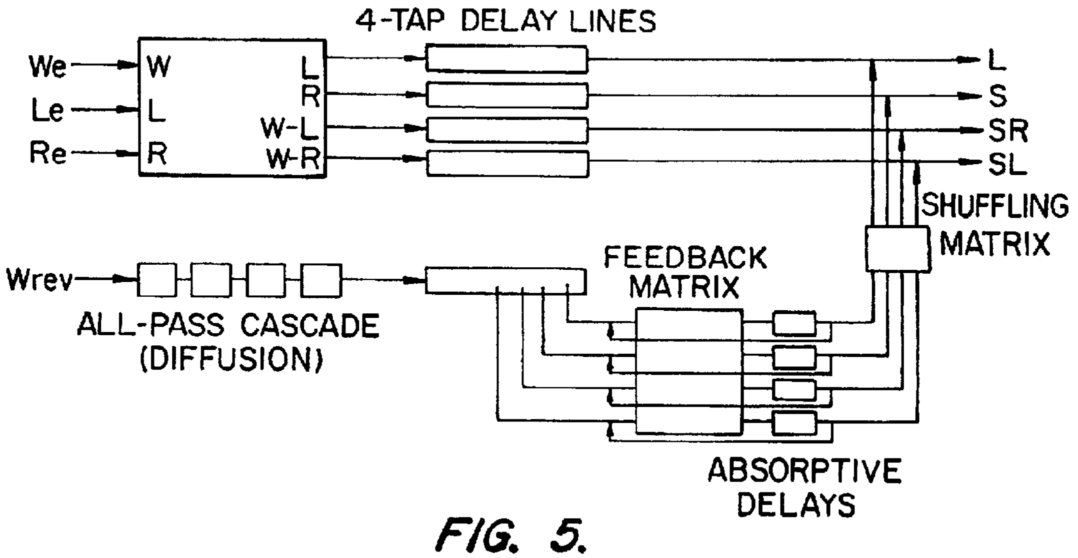
FIG. 5 is an implementation of the early reflection and late reverberation blocks.

FIG. 5 depicts a detailed implementation of the early reflection and reverb blocks included in the reverberation block 52 of FIG. 4. In FIG. 5, in the early reflection block 60, the filtered early reflection feed is input to an early encoder 62 which has the 3-channel (W, L, R) signal as an input a 4-channel (L, R, W-L, W-R), which function as the left, right, surround right, and surround left signals (L, R, SR, SL), as an output. Each channel of the 4-channel output signal in input into a 4-tap delay line 64 to implement successive early reflections.

In the late reverberation block 70, the filtered W channel of the source signal is input through an all-pass cascade (diffusion) filter 72 to a tapped delay line 74 inputting delayed feeds as a 4-channel input signal into a feedback matrix 76 including absorptive delay elements 78. The 4-channel output of the feedback matrix is input to a shuffling matrix 80 which outputs a 4-channel signal which is added to the (L, R, SR, SL) outputs of the early reflection block.

Effects of Obstacles and Partitions

The magnitude of each signal is adjusted according to whether it propagates through walls or diffracts around obstacles.

Occlusion occurs when a wall that separates two environments comes between source and listener, e.g., the wall separating S1 from the listener 10 in FIG. 2. Occlusion of sound is caused by a partition or wall separating two environments (rooms). There's no open-air sound path for sound to go from source to listener, so the sound source is completely muffled because it's transmitted through the wall. Sounds that are in a different room or environment can reach the listener's environment by transmission through walls or by traveling through any openings between the sound source's and the listener's environments. Before these sounds reach the listener's environment they have been affected by the transmission or diffraction effects, therefore both the direct sound and the contribution by the sound to the reflected sound in the listener's environment are muffled. In addition to this, the element which actually radiates sound in the listener's environment is not the original sound source but the wall or the aperture through which the sound is transmitted. As a result, the reverberation generated by the source in the listener's room is usually more attenuated by occlusion than the direct component because the actual radiating element is more directive than the original source.

Obstruction occurs when source and listener are in the same room but there is an object directly between them. There is no direct sound path from source to listener, but the reverberation comes to the listener essentially unaffected. The result is altered direct-path sound with unaltered reverberation. The Direct path can reach the listener via diffraction around the obstacle and/or via transmission through the obstacle. In both cases, the direct path is muffled (low-pass filtered) but the reflected sound form that source is unaffected (because the source radiates in the listener's environment and the reverberation is not blocked by the obstacle). Most often the transmitted sound is negligible and the low-pass effect only depends on the position of the source and listener relative to the obstacle, not on the transmission coefficient of the material. In the case of a highly transmissive obstacle (such as a curtain), however, the sound that goes through the obstacle may not be negligible compared to the sound that goes around it.

Additionally, different adjustments are made at different frequencies to model the frequency-dependent effects of occlusion and obstruction on the signals.

Environment Properties

In a preferred embodiment, the reverberation block of FIG. 3 or FIG. 4 is controlled by seven parameters, or "Environment properties":

Environment__size: a characteristic dimension of the room, measured in meters,

Reflections__dB: the intensity of the early reflections, measured in dB,

Reflections__delay: the delay of the first reflection relative to the direct path, Reverb__dB: the intensity of the late reverberation at low frequencies, measured in dB, Reverb__delay: the delay of the late reverberation relative to the first reflection, Decay__time: the time it takes for the late reverberation to decay by 60 dB at low frequencies, Decay__HF__ratio: the ratio of high-frequency decay time re. low-frequency decay time, The values of these parameters may be grouped in presets to implement a particular Environment, e.g., a padded cell, a cave, or a stone corridor. In addition to these properties, toggle flags may be set to TRUE or FALSE by the program to implement certain effects when the value of the Environment__size property is modified. The following is a list of the flags utilized in a preferred embodiment.

| Flag name | type | Default value |
|---|---|---|
| Decay__time__scale | | |
| Reflections__dB__scale | | |
| Reflections__delay__scale | | |
| Reverb__dB__scale | | |
| Reverb__delay__scale | | |

If one of these flags is set to TRUE, the value of the corresponding property is affected by adjustments of the Environment__size property. Changing Environment__size causes a proportional change in all Times or Delays and an adjustment of the Reflections and Reverb levels. Whenever Environment__size is multiplied by a certain factor, the other Environment properties are modified as follows:

if Reflections__delay__scale is TRUE, Reflections__delay is multiplied by the same factor (multiplying size by 2=>Reflections__delay is multiplied by 2)

if Reverb__delay__scale is TRUE, Reverb__delay is multiplied by the same factor.

if Decay__time__scale is TRUE, Decay__time is multiplied by the same factor.

if Reflections__dB__scale is TRUE, Reflections__dB is corrected as follows:

if Reflections__delay__scale is FALSE, Reflections is not changed.

otherwise, Reflections__dB=Reflections__dB−20*log 10(factor).

if Reverb__scale is TRUE, Reverb__dB is corrected as follows:

if Decay__time__scale is TRUE, Reverb__dB=Reverb__dB−20*log 10(factor).

if Decay__time__scale is FALSE, Reverb__dB=Reverb__dB−30*log 10(factor).

Sound Source Properties

The following list describes the sound source properties, which, in a prefered embodiment of the present invention, control the filtering and attenuation parameters in the source channel block for each individual sound source:

dist: source to listener distance in meters, clamped within [min__dist, max__dist].

min__dist, max__dist: minimum and maximum source-listener distances in meters.

Air__abs__HF__dB: attenuation in dB due to air absorption at 5 kHz for a distance of 1 meter.

ROF: roll-off factor allowing to adjust the geometrical attenuation of sound intensity vs. distance. ROF=1.0 to simulate the natural attenuation of 6 dB per doubling of distance.

Room__ROF: roll-off factor allowing to exagerate the attenuation of reverberation vs. distance.

Obst__dB: amount of attenuation at 5 kHz due to obstruction.

Obst__LF__ratio: relative attenuation at 0 Hz (or low frequencies) due to obstruction.

Occl__dB: amount of attenuation at 5 kHz due to occlusion.

Occl__LF__ratio: relative attenuation at 0 Hz (or low frequencies) due to obstruction.

Occl__Room__ratio: relative ratio of additional attenuation applied to the reverberation due to occlusion.

Figure 6:
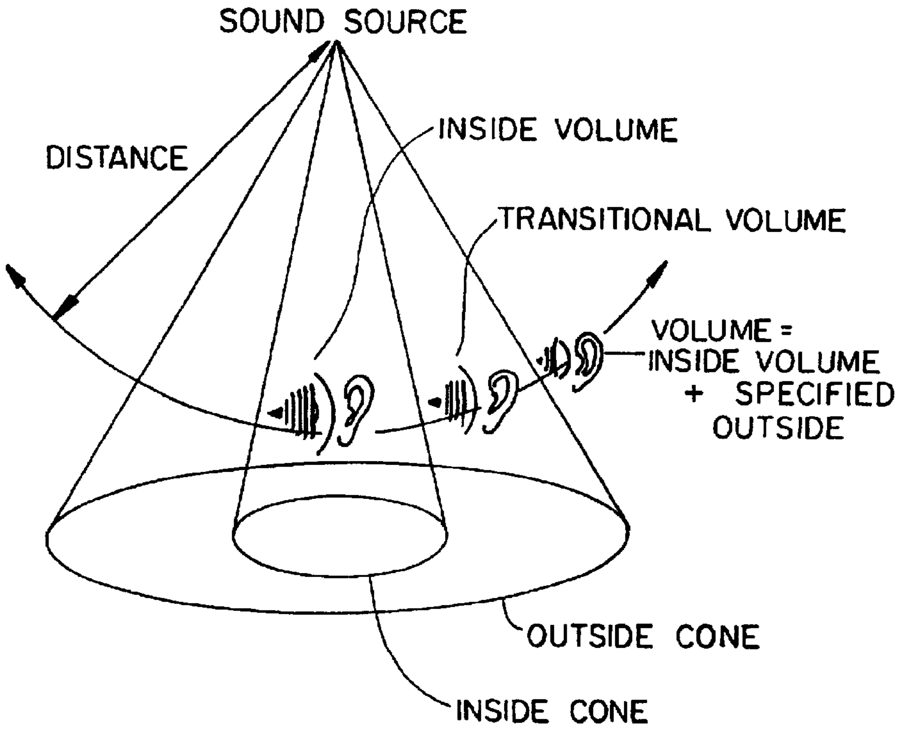
FIG. 6 is a depiction of the sound cones defining directivity.

The directivity of a sound source is modeled by considering inside and outside sound cones as depicted in FIG. 6, with the following properties:

Inside__angle.

Outside__angle.

Inside__volume__dB.

Outside__volume__dB.

Outside__volume__HF__dB: relative outside volume attenuation in dB at 5 kHz vs. 0 Hz.

Within the inside cone, defined by Inside__angle, the volume of the sound is the same as it would be if there were no cone, that is the Inside__volume__dB is equal to the volume of an omni directional source. In the outside cone, defined by an Outside__angle, the volume is attenuated by Outside__volume__dB. The volume of the sound between Inside__angle and Outside__angle transitions from the inside volume to the outside volume. A source radiates its maximum intensity within the Inside Cone (in front of the source)

and its minimum intensity in the Outside Cone (in back of the source). A sound source can be made more directive by making the Outside_angle wider or by reducing the Outside_volume_dB.

Source Channel Control Equations

The following equations control the filtering and attenuation parameters in the source channel block for each individual sound source, according to the values of the Source and Environment properties, in a prefered embodiment depicted in FIG. 4.

The direct-path filter and attenuation **42*d* and 44*d* in FIG. 4** combine to provide different attenuations at 0 Hz and 5 kHz for the direct path, denoted respectively direct_0 Hz_dB and direct_5 kHz_dB, where:

direct_0 Hz_dB=−20*log 10((min_dist+*ROF**(dist−min_dist))/min_dist)+Occl_dB*Occl_*LF*_ratio+Obst_dB*Obst_*LF*_ratio+direct_0 Hz_radiation_dB; and direct_5 kHz_dB=−20*log 10((min_dist+*ROF**(dist−min dist))/min_dist)+Air_abs_HF_dB*Air_abs_factorROF(dist−min_dist)+Occl_dB+Obst_dB+direct_5 kHz_radiation_dB.

In the above expression of direct_0 Hz_dB, direct_0 Hz_radiation_dB is a function of the source position and orientation, listener position, source inside and outside cone angles and Outside_volume_dB. Direct_0 Hz_radiation dB is equal to 0 dB for an omnidirectional source. In the expression of direct_5 kHz_dB, direct_5 kHz_radiation_dB is computed in the same way, except that Outside_volume_dB is replaced by (Outside volume_dB+Outside_volume_HF_dB).

The reverberation filter and attenuation **42*e* and 44*r* in FIG. 4** combine to provide different attenuations at 0 Hz and 5 kHz for the reverberation, denoted respectively room_0 Hz_dB and room_5 kHz_dB, where:

room_0 Hz_dB=−20*log 10((min_dist+Room_*ROF(dist−min_dist))/min_dist)−60ROF**(dist−min_dist)/(*c*0*Decay_time)

+min(Occl_dB*(Occl_*LF*_ratio+Occl_Room_ratio), room_0 Hz_radiation_dB); and room_5 kHz_dB=−20*log 10((min_dist+Room_*ROF**(dist−min_dist))/min_dist)

+Air_abs_*HF*_dBROF(dist−min_dist)−60ROF(dist−min_dist)/(*c*0*Decay_time_5 kHz)+min(Occl_dB*(1+Occl_Room_ratio), room_5 kHz_radiation_dB); and c0 is the speed of sound (=340 m/s).

In the expression of room_0 Hz_dB, room_0 Hz_radiation_dB is obtained by integrating source power over all directions around the source. It is equal to 0 dB for an omnidirectional source. An approximation of room_0 Hz_radiation_dB is obtained by defining a "median angle" (Mang) as shown in the equations below, where angles are measured from the front axis direction of the source:

room_0 Hz_radiation_dB=10*log 10([1−cos(Mang)+Opow*(1+cos(Mang))]/2);

where:

Mang=[Iang+Opow*Oang]/[1+Opow];

lang, Oang: inside and outside cone angles expressed in radians;

Opow=10^(Outside_volume/10).

In the expression of room_5 kHz_dB, room 5kHz_radiation_dB is computed in the same way as room_0 Hz_radiation_dB, with:

Opow=10^([Outside_volume+Outside_volume_*HF*]/10).

The more directive the source, the more the reverberation is attenuated. When Occlusion is set strong enough, the directivity of the source no longer affects the reverberation level and spectrum. As Occlusion is increased, the directivity of the source is progressively replaced by the directivity of the wall (which we assume to be frequency independent).

The early reflection attenuation **44*e* in FIG. 4** provide an attenuation for the early reflections, denoted early_0 Hz_dB, where:

early_0 Hz_dB=room_0 Hz_dB−20*log 10((min_dist+*ROF**(dist−min_dist))/min_dist).

Figure 7:
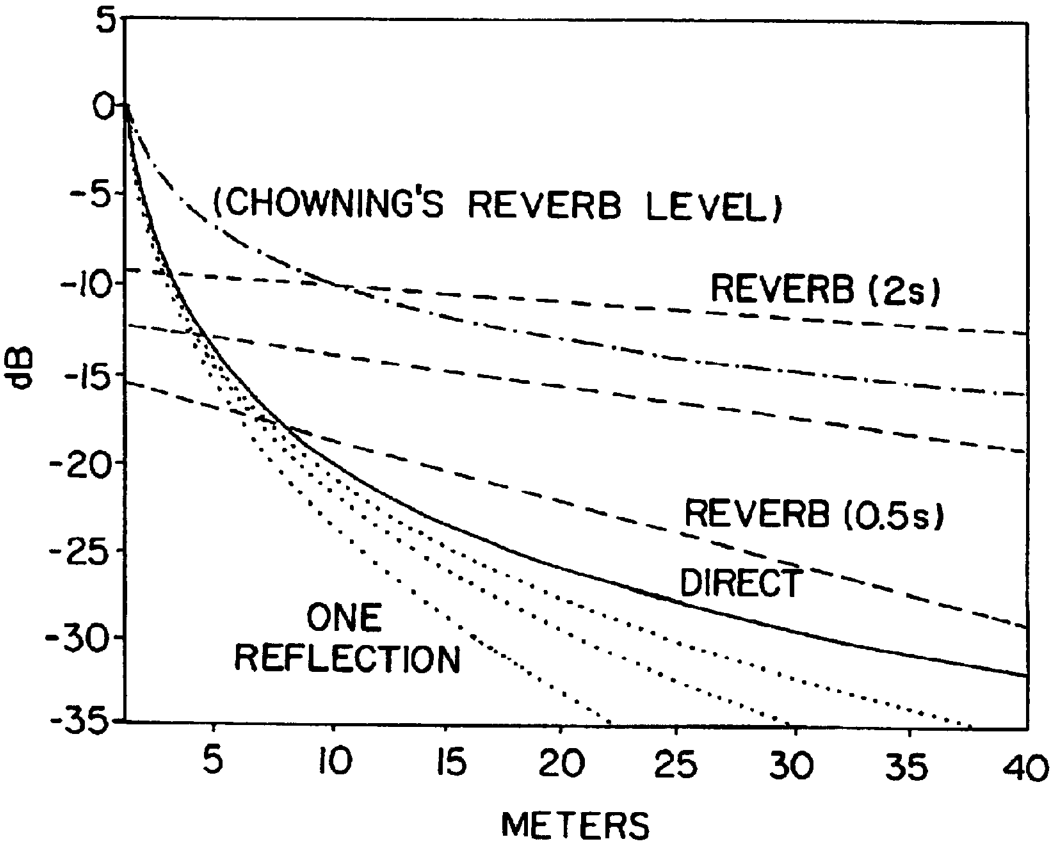
FIG. 7 is a graph depicting the intensities of the direct path, reverberation, and one reflection vs. source-listener distance for an omni-directional sound source.

FIG. 7 illustrates the variation in intensity of the direct path, the late reverberation and one reflection vs. source-listener distance for an omni-directional source, when ROF=1.0 and Room_ROF=0.0. The variation depends on the reverberation decay time and volume of the room. The reverberation intensity at 0 distance is proportional to the decay time divided by the room volume (in cubic meters).

The invention has now been described with reference to the preferred embodiments. In a preferred embodiment the invention is implemented in software for controlling hardware of a sound card utilized in a computer. As is well-known in the art the invention can be implemented utilizing various mixes of software and hardware. Further, the particular parameters and formulas are provided as examples and are not limiting. The techniques of the invention can be extended to model other environmental features. Accordingly, it is not intended to limit the invention except as provided by the appended claims.

What is claimed is:

1. A system for rendering a sound scene representing multiple sound sources and a listener at different positions in the scene, said system comprising:

a plurality of source channel blocks, each source channel block implementing environmental reverberation processing for an associated source, with each source channel block including:

at least one input for receiving a source signal to provide direct and early reflection feeds, and a late reverberation feed;

a direct path, coupled to receive said direct feed and to receive direct path control parameters specified for the associated source, said direct path including a direct attenuation element responsive to at least one of said direct path control parameters;

an early reflection path, coupled to receive said early reflection feed and to receive early reflection control parameters specified for the associated source, said early reflection path including an early attenuation element responsive to at least one of said early reflection control parameters; and a late reverberation path, coupled to receive said late reverberation feed and to receive late reverberation control parameters specified for the associated source, said late reverberation path including a late reverberation attenuation element responsive to at least one of said late reverberation control parameters;

a reverberation bus having an early reflection sub-bus coupled to an output of the early reflection path of each source channel block and a late reverberation sub-bus coupled to an output of each late reverberation path; and a common reverberation block, coupled to said reverberation bus, having an early reflection unit coupled to said early reflection sub-bus, for processing the outputs from the early reflection paths of said plurality of source channel blocks, and said reverberation block having a late reverberation unit coupled to the late reverberation sub-bus of said reverberation bus, for processing the outputs of the late reverberation paths of said plurality of source channel blocks.

2. The system of claim 1 where at least one of said direct, early reflection, and late reverberation paths comprises:

a variable delay path.

3. The system of claim 1 where at least one of said direct, early reflection, and late reverberation paths comprises:

a low-pass filter element.

4. The system of claim 1, wherein said early reflection encoding path includes an early pan element.

5. A method for rendering a sound scene representing a plurality of sound sources and a listener at different positions in the scene:

for each of the plurality of sound sources:

providing direct, early, and late feeds;

receiving a set of direct signal parameters specifying attenuation of the direct feed;

processing the direct feed to attenuate the direct feed thereby forming a processed direct feed;

receiving a set of early reflection signal parameters specifying the attenuation of the early feed;

processing the early feed to attenuate the early feed thereby forming a processed early feed;

receiving a set of late reverberation signal parameters specifying the attenuation of the late feed;

processing the late feed to attenuate the late feed thereby forming a processed late feed;

combining the processed early feeds from several sound sources to form a combined early feed;

performing early reflection processing on said combined early feed to form a multi-source early reflection signal;

combining the processed late feed from several sound sources to form a combined late feed;

performing late reverberation processing on said combined late feed to form a multi-source late reverberation signal;

combining the processed direct feeds from each sound source to form a combined direct feed; and combining the combined direct feed, multi-source early reflection signal, and multi-source late reverberation signal to form an environmentally processed multi-source output signal.

6. The method of claim 5 comprising:

delaying at least one of the direct, early, and late feeds.

7. The method of claim 5 comprising:

modifying the spectral content of at least one of the direct, early, and late feeds.

8. The method of claim 5, wherein processing the direct feed includes panning the direct feed as specified by said direct signal parameters thereby forming the processed direct feed, and processing the early feed includes panning the early feed as specified by said early feed signal parameters thereby forming the processed early feed.

9. A method, performed by a digital computer, of simulating the effects on the direct sound and reverberation of one of an obstruction and an occlusion, said method comprising:

when the obstruction is caused by an object located between a sound source and a listener, attenuating a magnitude of a low-frequency component of only the direct sound by a magnitude determined by a magnitude of a low-frequency obstruction parameter to simulate the effects of the obstruction; and when the occlusion is caused by a wall located between the sound source and the listener, attenuating a magnitude of low-frequency components of both the direct sound and reverberation by a magnitude determined by a magnitude of a low-frequency occlusion parameter to simulate the effect of the occlusion.

10. The method of claim 9 comprising:

in the event of an occlusion, additionally attenuating the reverberation relative to the attenuation applied to the direct sound by a ratio having a magnitude determined by the magnitude of a ratio parameter.

11. The method of claim 9, wherein attenuating comprises low-pass filtering.

12. A method, performed by a digital computer, of simulating the effect of distance between a sound source and a listener on the direct sound and reverberation, said method comprising:

attenuating the level of a low frequency portion of the direct sound, according to distance measured in units of a reference distance, by an LF_direct factor which is a decaying function of the distance;

attenuating the level of a high frequency portion of the direct sound, according to distance measured in units of a reference distance, by an HF_direct factor which is a decaying function of the distance;

attenuating the level of a low frequency portion of the reverberation, according to distance measured in units of a reference distance, by an LF_room factor which is a decaying function of the ratio of distance over reverberation decay time; and attenuating the level of a high frequency portion of the reverberation, according to distance measured in units of a reference distance, by an HF_room factor which is a decaying function of the ratio of distance over high-frequency reverberation decay time.

13. The method of claim 12 where:

said LF_direct factor, expressed in decibels, is determined by performing the following arithmetic operations:

$$-20 * \log 10((min\_dist+ROF*(dist-min\_dist))/min\_dist);$$

said HF_direct factor, expressed in decibels, is determined by performing the following arithmetic operations:

$$-20 * \log 10((min\_dist+ROF*(dist-min\_dist))/min\_dist);$$

said LF_room factor, expressed in decibels, is determined by performing the following arithmetic operations:

$$-20 * \log 10((min\_dist+Room\_ROF*(dist-min\_dist))/min\_dist) -60*ROF*(dist-min\_dist)/(c0*Decay\_time);$$ and said HF_room factor, expressed in decibels, is determined by performing the following arithmetic operations:

$$-20 * \log 10((min\_dist+Room\_ROF*(dist-min\_dist))/min\_dist) +Air\_abs\_HF\_dB*Air\_abs\_factor*ROF*(dist-min\_dist) -60*ROF*(dist-min\_dist)/(c0*Decay\_time\_HF)$$

where min__dist is the reference source-listener distance,

Air__abs__HF__dB is the attenuation in dB due to air absorption at a reference high frequency for a selected distance, Air__abs__factor is a factor to adjust or eliminate the effect of air absorption, ROF is a roll-off factor allowing to adjust the geometrical attenuation of sound intensity vs. distance where ROF=1.0 to simulate the natural attenuation of 6 dB per doubling of distance, Room__ROF is roll-off factor allowing to exaggerate the attenuation of reverberation vs. distance, Decay__time is the reverberation decay time, Decay__time__HF is the high frequency reverberation decay time and c0 is the speed of sound.

14. A method, performed by a digital computer, of simulating the effects on the direct sound and reverberation of occlusion caused by a wall located between a sound source and a listener, said method comprising:

integrating low-frequency source power radiated by the source in all directions to determine a magnitude of an LF__room__radiation parameter;

integrating the high-frequency source power radiated by the source in all directions to determine a magnitude of an HF__room__radiation parameter;

if the LF__room__radiation parameter is less than a low-frequency occlusion parameter, attenuating the magnitude of only a low-frequency component of the reverberation by a magnitude determined by the magnitude of LE__room__radiation parameter otherwise attenuating the magnitude of only a low-frequency component of the reverberation by a magnitude determined by the magnitude of an low-frequency obstruction parameter to simulate the effects of the occlusion; and if the HF__room__radiation parameter is less than an occlusion parameter attenuating the magnitude of only a high-frequency component of the reverberation by a magnitude determined by the magnitude of LF__room__radiation parameter otherwise attenuating the magnitude of only a low-frequency component of the reverberation by a magnitude determined by the magnitude of a high-frequency occlusion parameter to simulate the effects of the occlusion.

15. The method of claim 14 comprising:

if the LF__room__radiation parameter is less than a low-frequency occlusion parameter additionally attenuating the reverberation relative to the attenuation applied to the direct sound by a ratio having a magnitude determined by magnitude of a ratio parameter; and if the HF__room__radiation parameter is less than a high-frequency occlusion parameter additionally attenuating the reverberation relative to the attenuation applied to the direct sound by a ratio having a magnitude determined by magnitude of a ratio parameter.

16. A method, performed by a digital computer, of simulating the effect of distance between a sound source and a listener on the direct sound and reverberation, said method comprising:

attenuating the level of a portion of the direct sound, according to distance measured in units of a reference distance, by a Direct factor which is a decaying function of the distance; and attenuating the level of a portion of the reverberation, according to distance measured in units of a reference distance, by a Room factor which is a decaying function of the ratio of distance over reverberation decay time, wherein said Direct factor, expressed in decibels, is determined by performing the following arithmetic operations:

$$-20*\log 10((min\_dist+ROF*(dist-min\_dist)/min-dist);\ \text{and}$$

said Room factor, expressed in decibels, is determined by performing the following arithmetic operations:

$$-60*ROF*(dist-min\_dist)/(c0*Decay\_time);$$

where min__dist is the reference distance,

ROF is a roll-off factor allowing to adjust the geometrical attenuation of sound intensity vs. distance where ROF=1.0 to simulate the natural attenuation of 6 dB per doubling of distance, and Decay__time is the reverberation decay time and c0 is the speed of sound.

17. The method of claim 16 comprising:

attenuating the level of a high frequency portion of the reverberation, according to distance measured in units of a reference distance, by a HF__room factor which is a decaying function of the ratio of distance over high frequency reverberation decay time.

18. The method of claim 16 comprising:

attenuating the level of a high frequency portion of the reverberation, according to distance measured in units of a reference distance, by a HF__room factor which is a decaying function of the ratio of distance over high frequency reverberation decay time, where:

said HF__room factor, expressed in decibels, is determined by performing the following arithmetic operations:

$$-60*ROF*(dist-min\_dist)/(c0*Decay\_time\_HF)$$

where Decay__time__HF is the high frequency reverberation decay time.

* * * * *

UNITED STATES PATENT AND TRADEMARK OFFICE

CERTIFICATE OF CORRECTION

PATENT NO. : 6,917,686 B2
DATED : July 12, 2005
INVENTOR(S) : Jot et al.

It is certified that error appears in the above-identified patent and that said Letters Patent is hereby corrected as shown below:

Title page,
Item [57], ABSTRACT,
Line 9, delete "transmision" and insert -- transmission --, therefor.

Column 6,
Line 39, delete "exagerate" and insert -- exaggerate --, therefor.

Column 7,
Line 21, delete "(dist-min dist)" and insert -- (dist-min_dist) --, therefor.
Line 65, delete "room 5kHz" and insert -- room_5kHz --, therefor.

Column 9,
Line 18, after "scene" insert -- , said method comprising --.
Line 67, delete "low-freguency" and insert -- low-frequency --, therefor.

Column 10,
Line 51, after "))/min_dist)" delete ";" and insert
-- +Air_abs_HF_dB*Air_abs_factor*ROF*(dist-min_dist); --, therefor.

Column 11,
Line 34, delete "LE_room_radiation" and insert -- LF_room_radiation --, therefor.

Column 12,
Line 20, delete "(dist-min_dist)/min-dist);" and insert -- (dist-min_dist))/min_dist); --, therefor.

Signed and Sealed this

Eleventh Day of October, 2005

JON W. DUDAS
*Director of the United States Patent and Trademark Office*